United States Patent [19]
Van Pelt et al.

[11] Patent Number: 6,091,199
[45] Date of Patent: *Jul. 18, 2000

[54] HEAT SPREADER FOR ELECTRONIC BALLAST

[75] Inventors: James Neal Van Pelt, Hoffman Estates; Kent E. Crouse, Hanover Park, both of Ill.

[73] Assignee: Energy Savings, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/903,311

[22] Filed: Jul. 30, 1997

[51] Int. Cl.$^7$ ........................................................ H01J 7/24
[52] U.S. Cl. .............................. 315/50; 315/56; 361/720
[58] Field of Search ................................... 362/294, 373; 313/46, 47; 315/46, 49, 50, 70, 71, 94, 32, 51, 52, 53, 54, 56–58; 165/185; 174/16.3, 17 VA; 257/712, 718; 361/704–706, 709–720

[56] References Cited

U.S. PATENT DOCUMENTS

| | | | |
|---|---|---|---|
| 2,711,382 | 6/1955 | Smith-Johannsen | 165/185 |
| 4,738,024 | 4/1988 | Eberhardt | 29/830 |
| 5,015,803 | 5/1991 | Mahulikar et al. | 174/52.4 |
| 5,307,236 | 4/1994 | Rio et al. | 361/720 |
| 5,397,917 | 3/1995 | Ommen et al. | 257/698 |
| 5,629,581 | 5/1997 | Belle et al. | 313/318.12 |

OTHER PUBLICATIONS

Gottlieb, Irving M., The all–important matter of thermal conductivity, McGraw–Hill,Inc.,pp 101, 1992.

*Primary Examiner*—David H. Vu
*Attorney, Agent, or Firm*—Paul F. Wille

[57] ABSTRACT

An insulating enclosure for an electronic ballast has at least one major surface and a thermally conductive heat spreader at the major surface. The heat spreader is thermally coupled to at least one of the electronic components within the ballast and has an area greater than the area of the component as measured parallel with the major surface. The electronic components are thermally coupled to the heat spreader by a thermally conductive, deformable means such as caulk or by domes or dimples in the heat spreader that accommodate the variations in height among the electronic components. An electrically insulating layer can be located between the heat spreader and some of the components to prevent the heat spreader from electrically shorting the components.

9 Claims, 2 Drawing Sheets

6,091,199

HEAT SPREADER FOR ELECTRONIC BALLAST

BACKGROUND OF THE INVENTION

This invention relates to electronic ballasts for gas discharge lamps and, in particular, to removing heat from electrical components through a thermally insulating, plastic enclosure.

A fluorescent lamp is a non-linear load, i.e. the current through the lamp is not proportional to the voltage across the lamp and the current will increase rapidly unless there is a ballast in series with the lamp to limit current. An electronic ballast typically includes a converter for changing the alternating current (AC) from a power line to direct current (DC) and an inverter for changing the DC to high frequency AC. Converting from AC to DC is usually done with a full wave or bridge rectifier. A filter capacitor on the output of the rectifier stores energy for powering the inverter. Some ballasts include a "boost" circuit to improve power factor or to increase the voltage on the filter capacitor from approximately 140 volts to 300 volts or higher (from a 120 volt AC input). The inverter changes the DC to high frequency AC at 140–300 volts for powering one or more fluorescent lamps.

A boost circuit and an inverter each includes at least one "magnetic" (transformer or inductor). Because electronic ballasts operate at high frequency (e.g. 30 khz.), the magnetics in an electronic ballast are relatively small and this fact has been exploited to make ballasts physically smaller than in the past because the magnetics are usually the largest components in a ballast. While the magnetics can be made in almost any shape, it can be shown that the most efficient and least expensive magnetics are essentially cubic. Thus, the height of the magnetics above the printed circuit board sets a lower limit on the thickness of the ballast. The various heights of all the components makes the surface of a populated circuit board relatively uneven.

The efficiency of a ballast is the power consumed by a lamp divided by the total power supplied to the ballast. No ballast can deliver all the applied power to a lamp (one hundred percent efficiency). Some power is always dissipated in a ballast and the more compact designs of modern electronic ballasts cause difficulty in coping with the heat being generated in a small space. Components, particularly the magnetics, can overheat, thereby reducing the life and reliability of the components. A plastic enclosure for a ballast simplifies the problem of electrically insulating the ballast but complicates the problem of removing heat from the ballast.

A heat sink, i.e. a large thermal mass for absorbing heat from a source, within a ballast is not compatible with the idea of a compact ballast. Further, thermally coupling components to the heat sink is difficult clue to the various heights of the components on the circuit board. Exposing a heat sink, or some components, to outside the ballast is not feasible because of the need to electrically insulate the circuitry of the ballast.

In view of the foregoing, it is therefore an object of the invention to provide a heat spreader for conducting heat away from sources within the ballast through a plastic enclosure to a sink outside the ballast.

Another object of the invention is to provide a heat spreader that can accommodate heat sources of different heights.

A further object of the invention is to provide a heat spreader that does not reduce the electrical insulating benefits of a plastic enclosure.

Another object of the invention is to provide a heat spreader that does not increase the size of an electronic ballast.

SUMMARY OF THE INVENTION

The foregoing objects are achieved in the invention in which an electronic ballast includes a printed circuit board within an insulating enclosure. The enclosure has at least one major surface spaced from and generally parallel with the printed circuit board and a thermally conductive heat spreader at the major surface. The printed circuit board is populated with electronic components, including magnetic devices, active devices and passive devices. The heat spreader is thermally coupled to at least one of the electronic components and has an area greater than the area of the component as measured parallel with the major surface. In accordance with one aspect of the invention, the electronic components are thermally coupled to the heat spreader by a thermally conductive, deformable means such as caulk. In accordance with another aspect of the invention, an electrically insulating layer is located between the heat spreader and the printed circuit board to prevent the heat spreader from electrically shorting devices on the printed circuit board. The insulating layer includes holes to allow some of the electrical components to be thermally coupled to the heat spreader. In accordance with a third aspect of the invention, the heat spreader includes domes or dimples to accommodate the variations in height among the electronic components on the printed circuit board.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
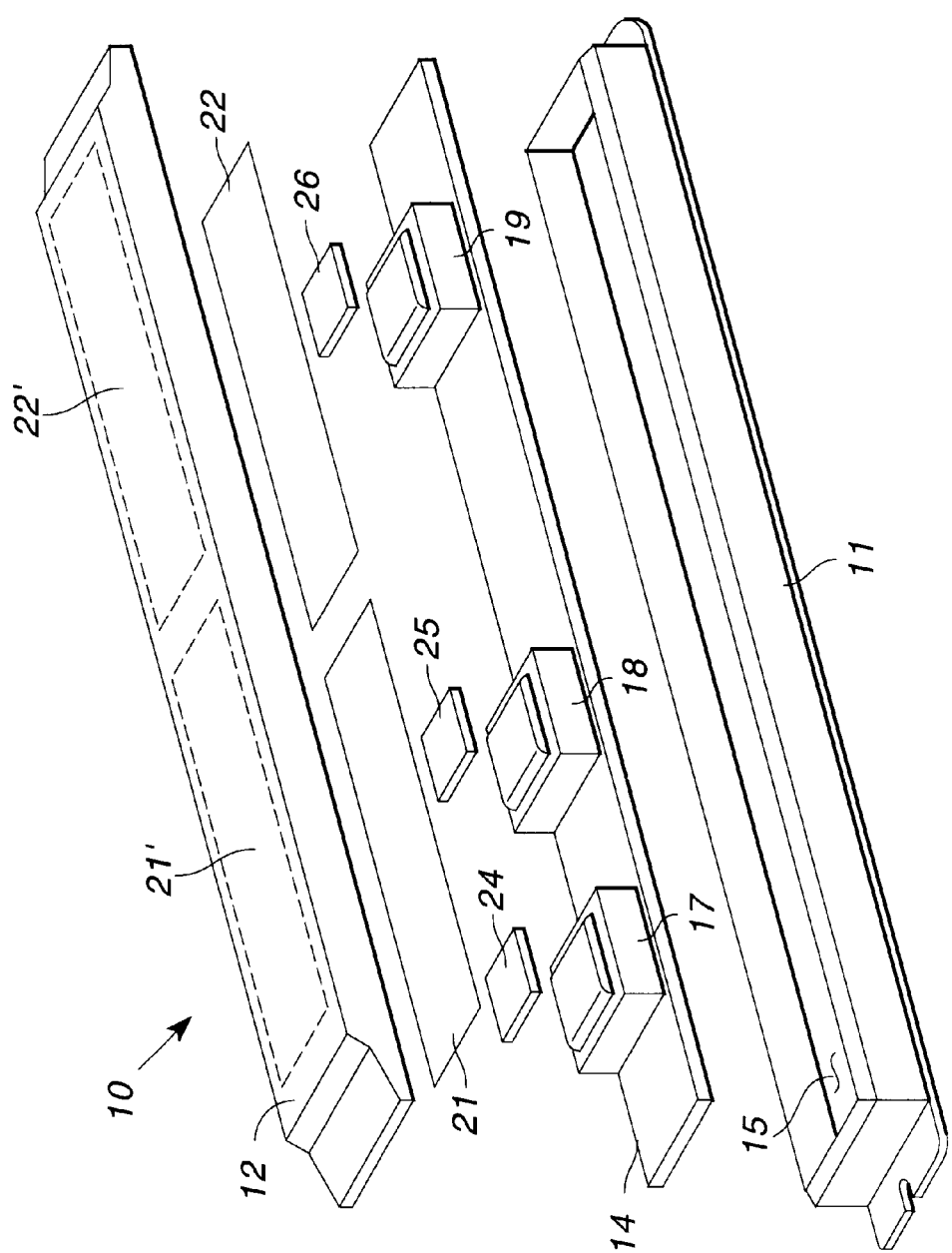
FIG. 1 is an exploded view of a ballast constructed in accordance with the invention.

In FIG. 1, ballast 10 includes an elongated, plastic enclosure in which base 11 is closed on five sides and cover 12 fits over base 11 to enclose printed circuit board 14. Printed circuit board 14 includes a plurality of electronic components that are attached to the board on either side of the board. Positioned as shown in FIG. 1, magnetics 17, 18 and 19 are attached to the upper surface of printed circuit board 14. Semiconductor devices and passive components, such as resistors or (capacitors, are attached to the underside of printed circuit board 14 and are not illustrated in FIG. 1.

In a normally operating ballast, the magnetics produce the most heat and adequately cooling the magnetics has been a problem in the prior art. In accordance with the invention, the heat from the magnetics is spread over a large area by a suitable heat spreader, such as metal foils 21 and 22. By spreading the heat over a wide area, heat is conducted more quickly to outside ballast 10, despite the relatively low thermal conductivity of the plastic enclosure, than the heat would be conducted without the spreader.

In one embodiment of the invention, heat spreaders 21 and 22 were made from self-adhesive metal foil attached to the inside of cover 12, as indicated by reference numbers 21' and 22'. The foil does not act as a heat sink; that is, the mass of the foil is smaller than the mass of the magnetics, not larger. The foil spreads the heat over a large area and this has been found to be sufficient to provide thermal coupling through the plastic enclosure to the exterior of the ballast, where air or a lighting fixture acts as a sink for absorbing heat from the ballast. Aluminum foil, 5–10 mils thick, which is sufficiently thin for the foil to remain essentially isothermal, has been found suitable for the invention. In one embodiment of the invention, the temperature of the magnetics in a ballast was reduced by as much as 15° C., greatly enhancing the lifetime and reliability of the ballast.

It is important that the area of the foil be greater than the area of the component being cooled. As illustrated in FIG. 1, the area of spreader 21 is greater than the combined areas of magnetics 17 and 18, measured in a plane parallel to the plane of spreader 21, i.e., parallel to the inside surface of cover 12. Similarly, spreader 22 has an area larger than the area of magnetic 19, measured in a plane parallel with the inside surface of cover 12.

Magnetics 17, 18, and 19 are coupled to heat spreaders 21 and 22 by a deformable member such as a thermally conductive caulk. Deformable member 24 couples magnetic 17 to spreader 21 and deformable member 25 couples magnetic 18 to spreader 21. Deformable member 26 couples magnetic 19 to spreader 22. A high thermal conductivity is not required for deformable members 24–26 because, when deformed, the members are relatively thin and provide sufficient coupling to the heat spreaders. A suitable caulk is Schnee-Morehead #5127. Other thermally conductive, deformable materials could be used instead.

Figure 2:
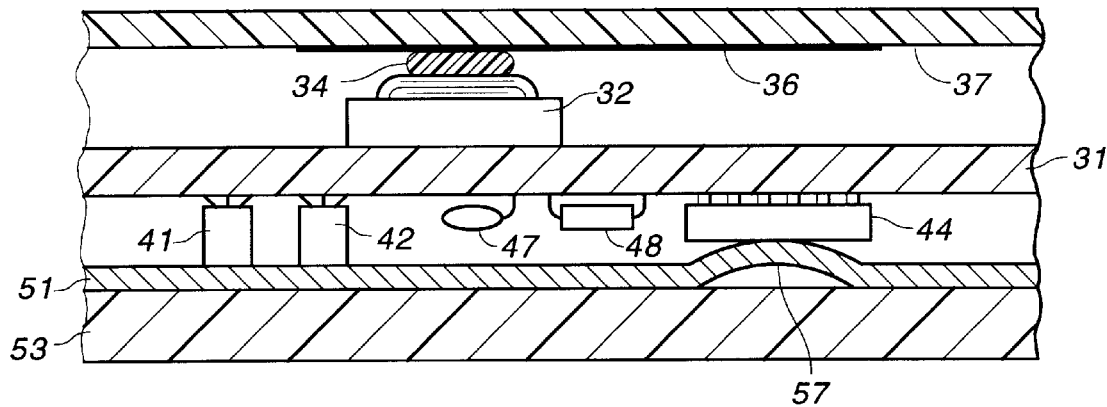
FIG. 2 is a cross-section of a portion of a ballast illustrating another aspect of the invention.

Although the magnetics in an electronic ballast are the principal sources of heat, they are not the only sources and the invention can be employed to cool other components within a ballast. As illustrated in FIG. 2, printed circuit board 31 includes magnetic 32 on the upper side of the printed circuit board and coupled through deformable member 34 to heat spreader 36 on the inside surface of cover 37. On the underside of printed circuit board 31 are a plurality of active and passive components, such as transistors 41 and 42, capacitor 47, resistor 48, and integrated circuit 44.

Heat spreader 51 is located on the upper surface of base 53 and provides cooling for the heat generating components by being in thermal contact with transistors 41 and 42 and being in thermal contact with integrated circuit 44. As illustrated in FIG. 2, heat spreader 51 includes dome or dimple 57, which deforms the heat spreader sufficiently to rise above the upper surface of base 53 to make thermal contact with integrated circuit 44. Although illustrated as either spherical or cylindrical in FIG. 2, dome 57 could have any suitable shape for making contact with the components on printed circuit board 31. Heat spreader 51 is not a heat sink in that it does not have a large thermal mass relative to the mass of the devices being cooled. Heat spreader 51 has a relatively low thermal mass and is approximately isothermal during normal operation of the ballast. In one embodiment of the invention, heat spreader 51 was a sheet of aluminum, thirty mils (0.76 mm.) thick. Any thermally conductive material can be used to construct heat spreader 51.

Figure 3:
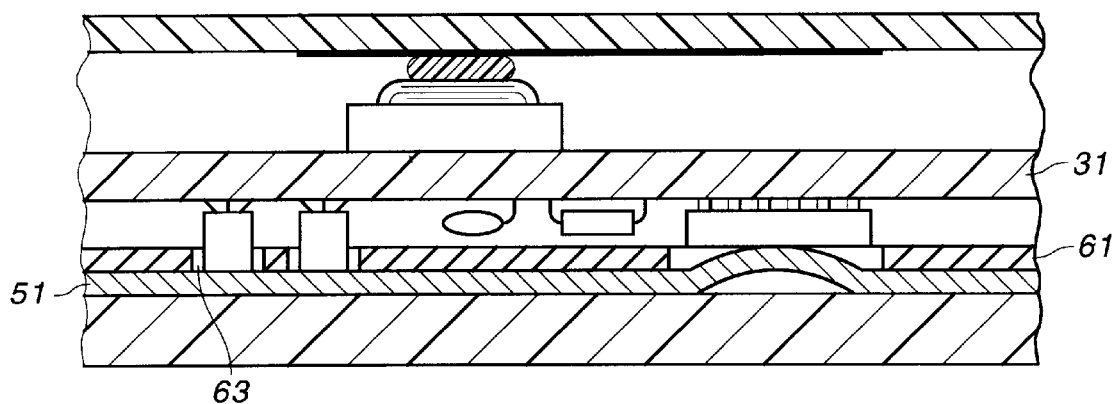
FIG. 3 is a cross-section of a portion of a ballast constructed in accordance with an alternative embodiment of the invention.

FIG. 3 illustrates a ballast constructed in accordance with an alternative embodiment of the invention wherein insulating layer 61 is added to heat spreader 51 to prevent heat spreader 51 from short circuiting components on printed circuit board 31. In a preferred embodiment of the invention, insulator 61 includes a plurality of apertures, such as aperture 63, at the locations of the components to be cooled. A plastic sheet or tape are suitable materials for insulator 61.

Figure 4:
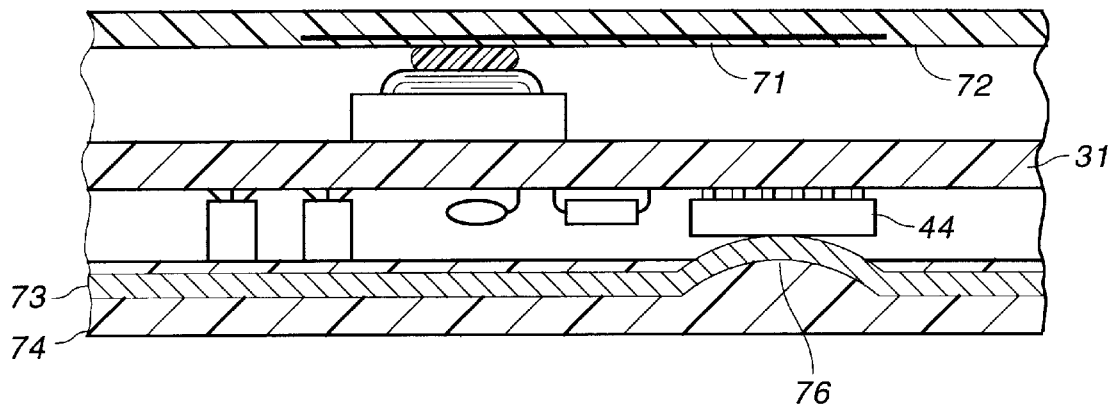
FIG. 4 is a cross-section of a portion of a ballast constructed in accordance with another alternative embodiment of the invention.

FIG. 4 illustrates an alternative embodiment of the invention in which the heat spreaders are molded into the plastic enclosure. Heat spreader 71 is embedded in cover 72 and positioned adjacent the lower surface of cover 72. This construction preserves the thermal coupling to outside the closure while electrically insulating heat spreader 71 from the electronics within the enclosure. Similarly, heat spreader 73 is embedded in base 74 and is located near the upper surface of base 74 such that dome 76 protrudes through the upper surface of base 73 for making contact with integrated circuit 44.

The invention thus provides a heat spreader for conducting heat away from sources within a ballast through the plastic enclosure of the ballast. The heat spreader can accommodate heat sources of a different height within the ballast and does not increase the size of the ballast. In many ballasts, the electronic components on the printed circuit board are potted, i.e., at least a portion of a ballast is filled with a resin that cures and hardens to lock the components in place and provide electrical insulation between the components. A heat spreader in accordance with the invention is compatible with potting the components in a ballast.

Having thus described the invention, it will be apparent to those of skill in the art that various modifications can be made within the scope of the invention. For example, heat spreaders 21 and 22 can be combined into a single heat spreader. The thickness and composition of the heat spreader is not critical, e.g. sheets or foils of aluminum, copper, brass, or other materials can be used. Heat spreader 73 can have bumps or domes under any desired component.

What is claimed as the invention is:

1. An electronic ballast for a gas discharge lamp, said ballast comprising:

a printed circuit board to which is attached a plurality of heat producing electronic components;

a plastic case for enclosing said printed circuit board, said plastic case having an interior and an exterior and having at least one major, substantially flat surface in said interior, wherein said major surface is spaced from and generally parallel with said printed circuit board;

a first metal sheet on said major surface inside said case, wherein the area of the metal sheet parallel with said surface is greater than the area of at least one of said electronic components as measured parallel with said surface;

wherein said first metal sheet is in thermal contact with said at least one electronic component;

whereby said first metal sheet increases the transfer of heat from said at least one electronic component to the exterior of said plastic case by transferring heat through said plastic case.

2. The ballast as set forth in claim 1 wherein said first metal sheet is adjacent to a first side of said printed circuit board and said ballast further includes a second metal sheet adjacent to a second side of said printed circuit board.

3. An electronic ballast as set forth in claim 1 wherein said at least one electronic component is a magnetic.

4. An electronic ballast as set forth in claim 1 and further including an insulating layer between said metal sheet and said printed circuit board, wherein said insulating layer includes holes aligned with at least some of said electronic components for enabling said at least some components to be thermally coupled to said metal sheet.

5. An electronic ballast as set forth in claim 1 wherein said metal sheet is a self-adhesive, metal foil on said major surface.

6. The ballast as set forth in claim 1 and further including:

a deformable, thermally conductive member coupling said first metal sheet to said at least one electronic component.

7. An electronic ballast for a gas discharge lamp, said ballast comprising:

a printed circuit board to which is attached a plurality of heat producing electronic components;

an insulating enclosure for said board, said enclosure having an interior and an exterior and having at least one interior, substantially flat major surface facing said printed circuit board;

a thermally conductive metal foil at said major surface;

a deformable, thermally conductive member;

wherein said metal foil (a) has an area greater than the area of at least one of said heat producing electronic components as measured parallel with said printed circuit board, (b) is thermally coupled to said at least one heat producing electronic component by said deformable, thermally conductive member, (c) is essentially isothermal;

whereby said metal foil provides thermal coupling through said insulating enclosure to the exterior of said enclosure.

8. The ballast as set forth in claim 7 wherein said at least one heat producing electronic component is a magnetic device.

9. The ballast as set forth in claim 7 wherein said deformable, thermally conductive member is a conductive caulk.

* * * * *